(12) United States Patent
Kang

(10) Patent No.: US 7,772,131 B2
(45) Date of Patent: Aug. 10, 2010

(54) METHOD OF FABRICATING SEMICONDUCTOR DEVICE

(75) Inventor: Jae-Hyun Kang, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 361 days.

(21) Appl. No.: 11/844,605

(22) Filed: Aug. 24, 2007

(65) Prior Publication Data

US 2008/0054475 A1   Mar. 6, 2008

(30) Foreign Application Priority Data

Aug. 31, 2006   (KR) .................... 10-2006-0083349

(51) Int. Cl.
*H01L 21/31* (2006.01)
(52) U.S. Cl. ...................................... 438/778
(58) Field of Classification Search ............. None
See application file for complete search history.

(56) References Cited

U.S. PATENT DOCUMENTS 4,073,759 A  *  2/1978  Lowry et al. ............... 524/61
2004/0207084 A1 * 10/2004  Hedrick et al. ............. 257/751

* cited by examiner

*Primary Examiner*—Scott B Geyer
(74) *Attorney, Agent, or Firm*—Sherr & Vaughn, PLLC

(57) ABSTRACT

In embodiments, when forming a metal line of the semiconductor device, a developer having an amine group may coated on the metal line layer such that the amine group remains on a surface of the metal line layer. Further, a method of fabricating a semiconductor device may include forming a metal line layer for interlayer connection of the semiconductor device, performing a first photo process by coating a first photoresist on the metal line layer, after performing the first photo process, removing the first photoresist for a rework, after removing the first photoresist, coating a developer having an amine group on the metal line layer, after coating the developer, coating a second photoresist on the metal line layer, and performing a photo process by employing the second photoresist.

11 Claims, 6 Drawing Sheets

O₂ PLASMA ASHING

METHOD OF FABRICATING SEMICONDUCTOR DEVICE

The present application claims priority under 35 U.S.C. 119 and 35 U.S.C. 365 to Korean Patent Application No. 10-2006-0083349 (filed on Aug. 31, 2006), which is hereby incorporated by reference in its entirety.

BACKGROUND

To simplify a process and reduce costs at the time of an aluminum (Al) metal process ranging from 0.18 μm technology to 0.13 μm technology, a photo process may be performed without using a BARC layer used in some related art photo processes.

Instead of using an ARC layer, a method of processing Hexamethyldisilazane (HMDS), coating a photoresist on metal, such as TiN, and then forming patterns of the photoresist may be used.

HMDS may have a chemical structure of $(CH_3)_3Si-NH-Si(CH_3)_3$. The method may improve adhesive force between the substrate and the photoresist through a chemical reaction of oxygen (O) coupled on a Si substrate and HMDS.

HMDS may serve to change hydrophilicity to the lipophilic property, and may be limited to prevent a sliding phenomenon of the photoresist due to notching.

FIG. 1 is a view illustrating a related art reaction mechanism between HMDS and a silicon wafer.

Referring to FIG. 1, HMDS may be one of silane coupling agents and may have a lipophilic organic functional group at one side and a methoxy group or an amine group, that is, a functional group. HMDS may be used to change the surface properties of a wafer.

A surface of the wafer may be processed by using HMDS. The surface of the wafer may then be changed to an organic property by $(CH_3)_3Si$, as illustrated in FIG. 1.

FIG. 2 illustrates a related art photo process and FIG. 3 is a SEM photograph illustrating a photoresist in a related art photo process.

Referring to FIGS. 2 and 3, when only HMDS is processed on TiN and an exposure process is performed, sidewalls of photoresist 10 may not have a uniform profile when photoresist 10 is patterned. This may be because TiN may have an amine group in structure.

In the related art, if an ARC layer is not used, light may be reflected from the substrate surface and the reflected light may reach both sidewalls of photoresist 10. Thus, a standing wave phenomenon in which the sidewalls of photoresist 10 may not be uniform may be generated.

If erroneous alignment of the photoresist is generated or if an error occurs in a CD target at the time of the photo process, a rework of the photo process may be carried out. In this case, ashing employing $O_2$ plasma may be generally performed.

FIGS. 4 to 6 illustrate a process of performing a rework at the time of a photo process and FIGS. 7 and 8 are SEM photographs illustrating a photoresist collision phenomenon.

A photoresist with an alignment error or a photoresist in which errors occur in a CD target may be removed. An $O_2$ plasma ashing process may then be performed.

Referring to FIG. 5, the surface of the wafer may be oxidized by the $O_2$ plasma ashing process, and specific oxide 20 may be formed on TiN.

Referring to FIG. 6, since photoresist 10 for forming via holes or contact hole may not be adhered to the surface of the wafer at the time of a metal process, a problem may occur in that photoresist 10 may be inclined.

In other words, as shown in FIGS. 7 and 8, at the time of the rework of the photo process, the wafer surface may be oxidized and the photoresist having an oxidization property may not adhere to the wafer surface. Consequently, the photoresist may be inclined.

This may degrade the characteristics of the semiconductor device, and may also increase the manufacturing cost of the semiconductor device.

SUMMARY

Embodiments relate to a method of fabricating a semiconductor device and to a method of fabricating semiconductor devices that may improve an adhesive force between a photoresist and a substrate at the time of a photo process (i.e., photolithographic process).

Embodiments relate to a method of fabricating of a semiconductor device that may enhance an adhesive force between a photoresist and a wafer at the time of a rework of a photo process.

According to embodiments, a method of fabricating a semiconductor device may include coating a developer having an amine group on the metal line layer at the time of a process of forming a metal line of the semiconductor device so that the amine group remains on a surface of the metal line layer.

According to embodiments, a method of fabricating a semiconductor device may include forming a metal line layer for interlayer connection of the semiconductor device, performing a first photo process by coating a first photoresist on the metal line layer, after performing the first photo process, removing the first photoresist for a rework, after removing the first photoresist, coating a developer having an amine group on the metal line layer, after coating the developer, coating a second photoresist on the metal line layer, and performing a photo process by employing the second photoresist.

According to embodiments, the developer may include TMAH having a molecular formula of $N(CH_3)_4OH$.

According to embodiments, the first photoresist may be removed, and an OH group may then be formed on a surface of the metal line layer, and the amine group may be formed on the surface of the metal line layer by means of the developer having the amine group.

DRAWINGS

DETAILED DESCRIPTION

Figure 1:
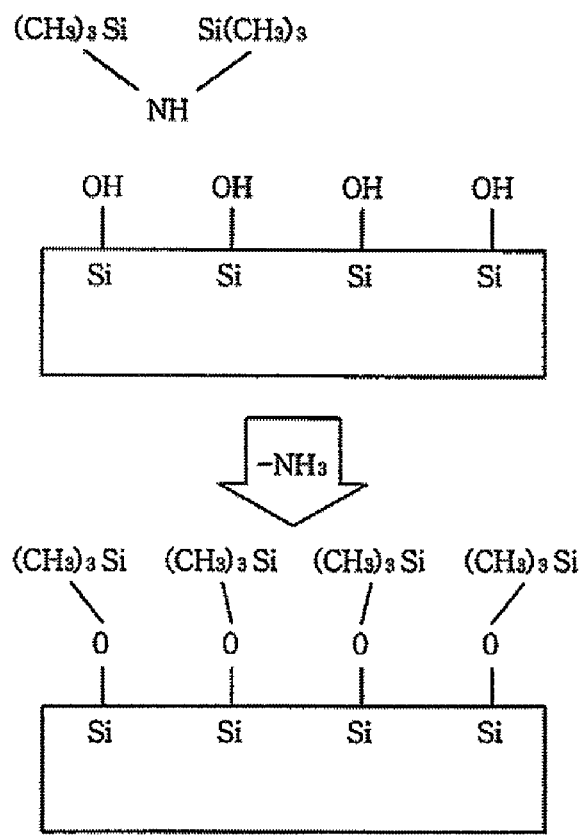
FIG. 1 is a drawing illustrating a related reaction mechanism between HMDS and a silicon wafer.
Figure 2:
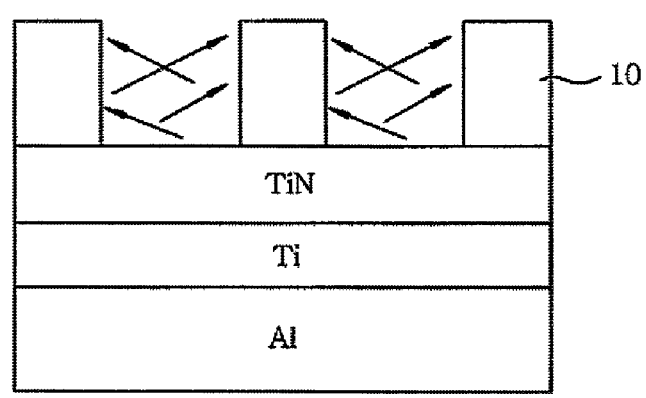
FIG. 2 is a drawing illustrating a related art photo process.
Figure 3:
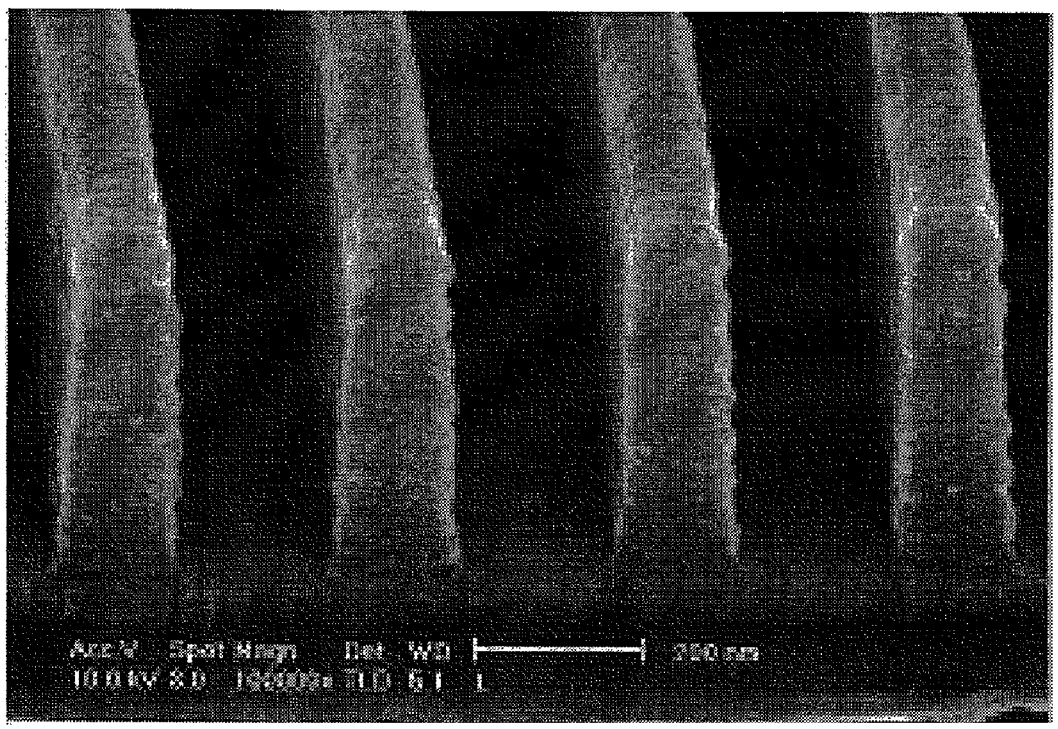
FIG. 3 is a SEM photograph illustrating a photoresist in a related art photo process.
Figure 4:
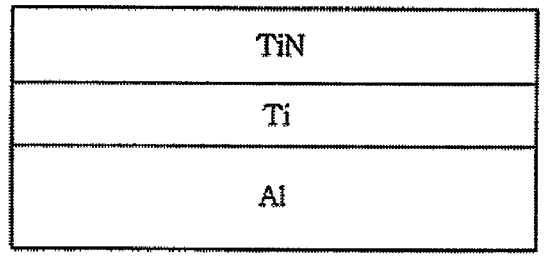
FIGS. 4 to 6 are drawings illustrating a process of performing a rework at the time of a photo process.
Figure 5:
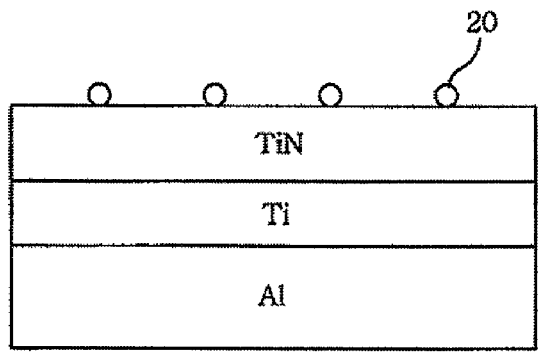
Figure 6:
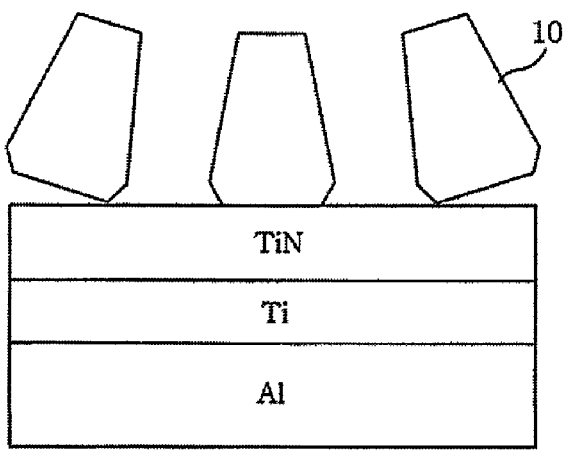
Figure 7:
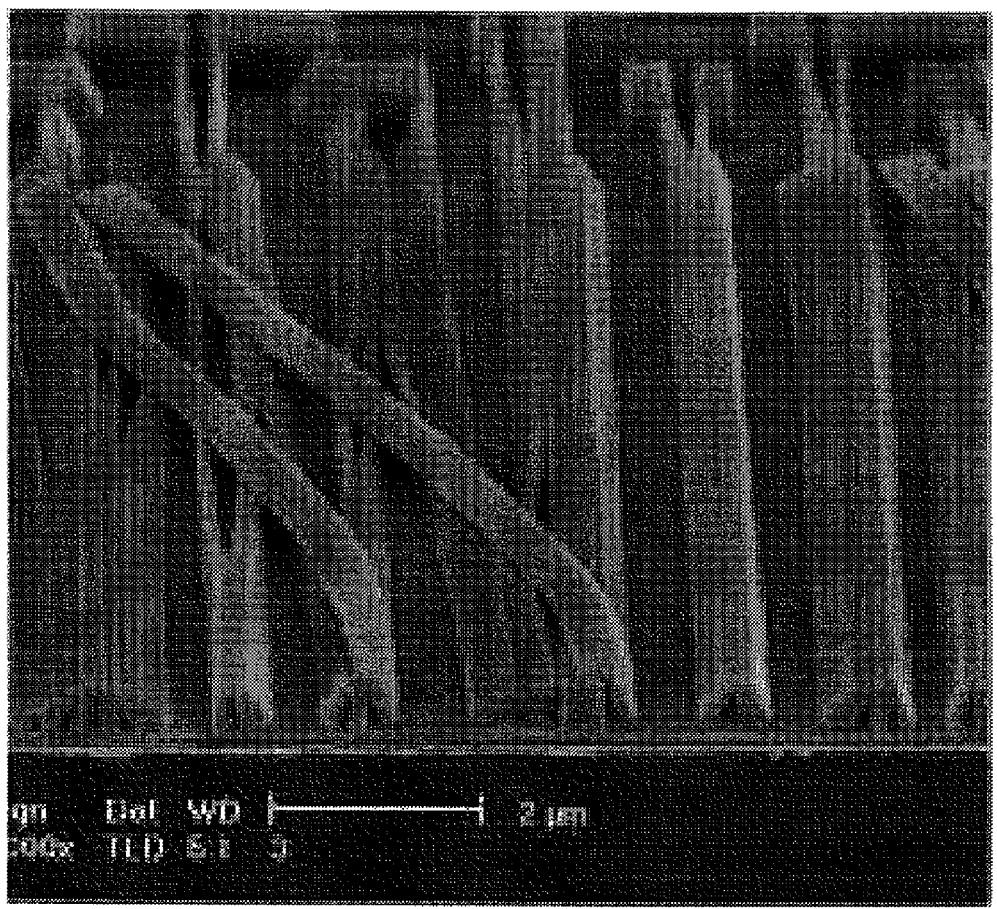
FIGS. 7 and 8 are SEM photograph illustrating a photoresist collision phenomenon.
Figure 8:
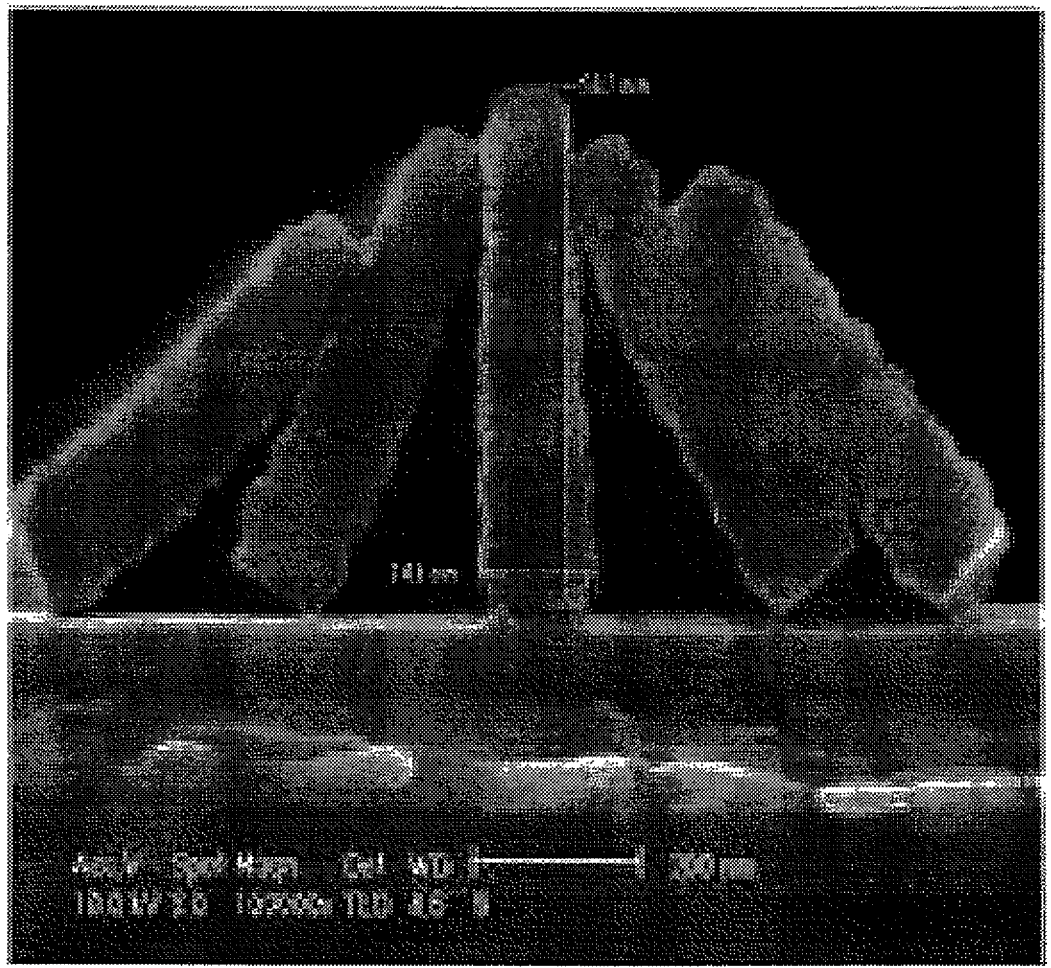
Figure 9:
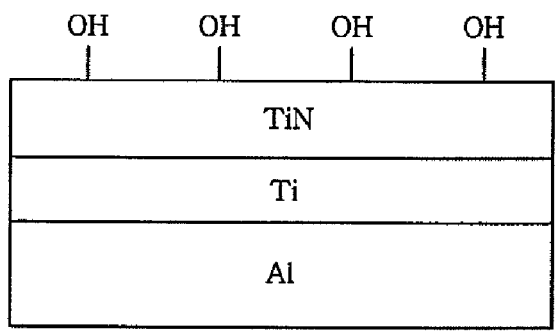
FIGS. 9 to 11 are drawings illustrating a method of fabricating a semiconductor device according to embodiments.
Figure 10:
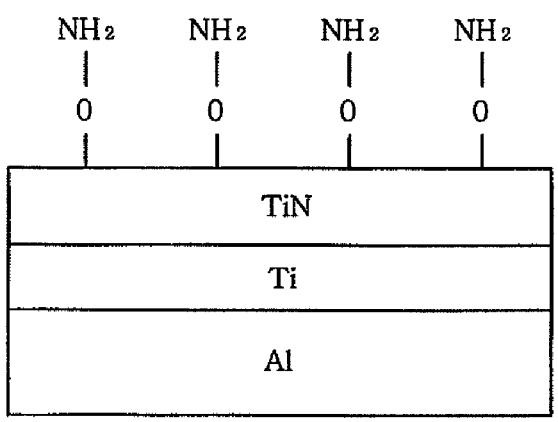
Figure 11:
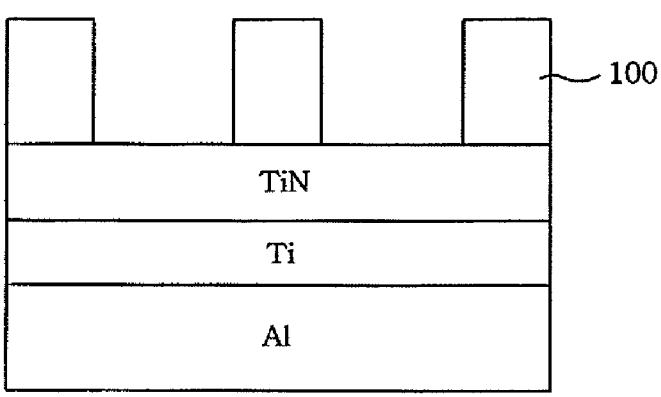

FIGS. 9 to 11 are drawings illustrating a method of fabricating a semiconductor device according to embodiments.

Referring to FIGS. 9 to 11, in embodiments an Al/Ti/TiN stack structure may be a metal line layer for interlayer connection of a semiconductor device. According to embodiments, a fabrication method may also be applied other structures, such as a W/Ti/TiN stack structure, an Al/TiN stack structure, or a W/TiN stack structure.

In embodiments, the semiconductor device may have a stack structure of Al, Ti, and TiN layers having a prescribed thickness. In embodiments, however, Al may be used as metal for interlayer connection, and a semiconductor substrate (not shown) may be formed below Al.

According to embodiments, elements for a semiconductor device, such as an isolation layer, a gate insulating layer, a gate electrode, a source/drain region, a capacitor, and a lower metal line, may be formed over a semiconductor substrate. An interlayer insulating layer may be formed on a top of the semiconductor substrate.

Referring to FIG. 9, in embodiments, oxide may be formed on a metal line layer formed of TiN at the time of a rework of a photo process. The rework of a photo process may be performed because a misalignment of the photoresist at the time of the photo process.

In embodiments, the oxide formed on the metal line layer may be easily combined with H in the air, which may form OH groups on the surface of the metal line layer, as illustrated in FIG. 9.

In order for an amine group to exist on the metal line layer formed of TiN, a process of coating a resist developer including amine on the metal line layer may be carried out.

In embodiments the resist developer may be used and may enhance an adhesive force between the photoresist and the metal line layer.

In embodiments, if exposure is performed on the metal line layer (in embodiments TiN), the photoresist sensitively may react to the amine group. In particular, at the time of a rework process, an oxidization phenomenon on the surface of the metal line layer due to $O_2$ plasma ashing may have a direct effect on the photoresist profile.

According to embodiments, a process of coating the resist developer including amine on the metal line layer may be implemented before the photoresist is formed.

The photoresist developer may include a Tetramethylamine Hydroxide (TMAH) solution, and the molecular formula of TMAH may become $N(CH_3)_4OH$, as shown in FIG. 9.

In embodiments, the TMAH developer may include a mixture of Tetramethylamine Chloride (TMAC) and water, and may be an alkaline aqueous solution that may be used to melt the photoresist in which a region exposed after exposure may be decomposed. In embodiments, the TMAH developer may be used to enhance adhesive force between the photoresist and the metal line layer at the time of the rework of the photo process.

In embodiments, if the TMAH solution is coated on the wafer surface, that is, the metal line layer before the photoresist is formed, the amine group may remain on the metal line layer.

In other words, referring to FIG. 10, if the TMAH solution is coated on the metal line layer, OH and the TMAH on the metal line layer react to each other, oxygen (O) and $N(CH_3)_4$ may be combined on the metal line layer.

According to embodiments, as a result of the chemical reaction between TMAH and OH, ethanol ($C_2H_5OH$) may result through hydrolysis.

The surface of the metal line layer may be aminized by $N(CH_3)_4$. The surface of the metal line layer aminized by $N(CH_3)_4$ may have a basis property, so that adhesive force between the metal line layer and a subsequent photoresist may be enhanced when forming the photoresist.

Referring to FIG. 11, in embodiments, if photoresist 100 is formed on the metal line layer, such as TiN, photoresist 100 may have acidity and may have strong adhesive force with the surface of the metal line layer having the basic property.

In embodiments, the existing HMDS may not be coated on the substrate in a liquid state, but may be deposited on the substrate in a vapor state. Thus, a chamber for deposition may be additionally provided in a track. If a developer unit is used, however, chambers for coating and baking may be further installed within the track in this space. Accordingly, there may be an advantage in that process efficiency may be improved.

Embodiments may improve a process efficiency in fabricating semiconductor devices and may also enhance adhesive force between a photoresist and a metal line layer at the time of the rework of a photo process.

Embodiments may reduce costs in fabricating semiconductor devices since HMDS for development may be replaced at the time of a photo process.

In embodiments, since adhesive force between the photoresist and the metal line layer may be enhanced, an undercut phenomenon of the photoresist may be prevented. Accordingly, CD uniformity and process margin can be improved.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method of fabricating a semiconductor device, comprising:
    forming a metal line layer over a substrate; and
    coating a developer having an amine group on a surface of the metal line layer such that the amine group remains on the surface of the metal line layer, wherein the developer comprises Tetramethylamine (TMAH) having a molecular formula of $N(CH_3)_4OH$.

2. The method of claim 1, further comprising forming a first photoresist over the metal line layer and the developer.

3. The method of claim 1, wherein the developer is coated on the metal line layer after performing a first photo process on the metal line layer using a second photoresist and after removing the second photoresist.

4. The method of claim 3, wherein an OH group is formed on the surface of the metal line layer and the amine group is formed over the surface of the metal line layer using the developer having the amine group after the second photoresist is removed.

5. The method of claim 3, further comprising performing a second photo process on the metal line layer after coating the developer and forming the first photoresist.

6. The method of claim 1, wherein the metal line layer comprises a stack structure of Al, Ti, and TiN.

7. A method of fabricating a semiconductor device, comprising:
    forming a metal line layer for interlayer connection of a semiconductor device;
    performing a first photo process by coating a first photoresist over the metal line layer;
    removing the first photoresist to perform a rework after performing the first photo process; and
    coating a developer having an amine group on the metal line layer after removing the first photoresist.

8. The method of claim 7, further comprising:
    coating a second photoresist on the metal line layer after coating the developer; and
    performing a photo process using the second photoresist.

9. The method of claim 8, wherein the developer comprises TMAH having a molecular formula of $N(CH_3)_4OH$.

10. The method of claim 8, wherein after the first photoresist is removed, an OH group is formed on a surface of the metal line layer, and the amine group is formed over the surface of the metal line layer using the developer having the amine group.

11. The method of claim 8, wherein the metal line layer comprises a stack structure of Al, Ti, and TiN.

* * * * *